United States Patent
Tan et al.

(10) Patent No.: US 9,065,437 B2
(45) Date of Patent: Jun. 23, 2015

(54) CIRCUIT FOR DRIVING HIGH-SIDE TRANSISTOR UTILIZING VOLTAGE BOOST CIRCUITS

(71) Applicant: MediaTek Singapore Pte. Ltd., Singapore (SG)

(72) Inventors: Wee Guan Tan, Singapore (SG); Siong Siew Yong, kl (MY)

(73) Assignee: MediaTek Singapore Pte. Ltd., Solaris, Singapore (SG)

( * ) Notice: Subject to any disclaimer, the term of this patent is extended or adjusted under 35 U.S.C. 154(b) by 0 days.

(21) Appl. No.: 14/257,983

(22) Filed: Apr. 21, 2014

(65) Prior Publication Data

US 2014/0320177 A1    Oct. 30, 2014

Related U.S. Application Data

(60) Provisional application No. 61/816,957, filed on Apr. 29, 2013.

(51) Int. Cl.
    *H03K 17/06*          (2006.01)
    *H03K 17/28*          (2006.01)
    *H03K 17/00*          (2006.01)

(52) U.S. Cl.
    CPC ..................... *H03K 17/00* (2013.01)

(58) Field of Classification Search
    CPC   H03K 17/063; H03K 19/01735; H03K 17/00
    USPC .................................................. 327/383, 390
    See application file for complete search history.

(56) References Cited

U.S. PATENT DOCUMENTS

| | | | | |
|---|---|---|---|---|
| 4,061,929 A * | 12/1977 | Asano | ........................... | 327/589 |
| 5,359,244 A | 10/1994 | Hopkins | | |
| 5,801,579 A * | 9/1998 | Le et al. | ........................ | 327/537 |
| 5,939,928 A * | 8/1999 | Le et al. | ........................ | 327/390 |
| 6,060,937 A * | 5/2000 | Singer et al. | ................... | 327/390 |
| 6,229,740 B1 * | 5/2001 | Ogura | ...................... | 365/189.11 |
| 6,525,574 B1 * | 2/2003 | Herrera | ........................... | 327/94 |
| 6,833,753 B2 * | 12/2004 | Das | ............................... | 327/536 |
| 7,026,862 B2 * | 4/2006 | Nakamura | .................... | 327/536 |
| 7,157,957 B2 * | 1/2007 | Kim | ............................... | 327/390 |
| 7,944,250 B2 * | 5/2011 | Jansen | ........................... | 327/108 |
| 8,115,518 B1 * | 2/2012 | Ali | ................................... | 327/91 |
| 8,354,865 B1 * | 1/2013 | Oo | ................................... | 327/94 |
| 8,723,556 B2 * | 5/2014 | Thomas | ........................... | 327/94 |

* cited by examiner

*Primary Examiner* — Kenneth Wells
(74) *Attorney, Agent, or Firm* — Winston Hsu; Scott Margo (57) ABSTRACT

A circuit for driving a transistor includes a drive circuit, a first voltage boost circuit and a second voltage boost circuit. The drive circuit has a first specific node, a second specific node, and a third specific node coupled to a control node of the transistor. The drive circuit is arranged for coupling the first specific node to the third specific node according to at least a voltage of the first specific node and a voltage of the second specific node in order to charge the control node. The first voltage boost circuit is coupled between the first specific node and a connection node of the transistor, and is arranged for boosting the voltage of the first specific node. The second voltage boost circuit is coupled between the first specific node and the second specific node, and is arranged for boosting the voltage of the second specific node.

31 Claims, 10 Drawing Sheets

CIRCUIT FOR DRIVING HIGH-SIDE TRANSISTOR UTILIZING VOLTAGE BOOST CIRCUITS

CROSS REFERENCE TO RELATED APPLICATIONS

This application claims the benefit of U.S. provisional application No. 61/816,957, filed on Apr. 29, 2013, the contents of which are incorporated herein by reference.

BACKGROUND

The disclosed embodiments of the present invention relate to drive circuitry, and more particularly, to a drive circuitry capable of generating a stable drive voltage beyond a supply voltage.

In order to pass a large current between two nodes (e.g. a source and a drain) of an n-channel metal-oxide-semiconductor field-effect transistor switch (NMOSFET switch or NMOS switch) with a relatively small voltage drop therebetween, a charge pump technique can be used to elevate the gate voltage of the NMOS switch to thereby decrease a turn-on resistance thereof.

In the charge pump technique, charges are dumped onto the gate of the NMOS switch according to alternate phases of a clock signal. By means of a diode or a diode-like device (e.g. a diode-connected MOSFET) which prevents the charges from flowing in the reverse direction, the charges can be stored and accumulated at the gate, thus boosting the gate voltage. However, usage of the diode comes with the penalty of a diode voltage drop which can lower the maximum voltage that the gate of the NMOS switch can be boosted to. This voltage drop can be significant in an on-chip implementation where the supply voltage generally is 5V or lower.

A bootstrap capacitor technique can be more suitable for an on-chip implementation. A bootstrap capacitor is used to boost the gate voltage of the NMOS switch. As charges on the bootstrap capacitor will leak over time, the gate voltage will decrease, possibly to the point where the NMOS switch will turn off. Thus, there is a need for a novel drive circuitry capable of generating a high and stable drive voltage.

SUMMARY

In accordance with exemplary embodiments of the present invention, a drive circuitry capable of generating a stable drive voltage beyond a supply voltage is proposed to solve the above-mentioned problem.

According to an embodiment of the present invention, an exemplary circuit for driving a transistor is disclosed. The exemplary circuit comprises a drive circuit, a first voltage boost circuit and a second voltage boost circuit. The drive circuit has a first specific node, a second specific node and a third specific node, wherein the third specific node is coupled to a control node of the transistor, and the drive circuit is arranged for coupling the first specific node to the third specific node according to at least a voltage of the first specific node and a voltage of the second specific node in order to charge the control node of the transistor. The first voltage boost circuit is coupled between the first specific node and a connection node of the transistor, and is arranged for boosting the voltage of the first specific node. The second voltage boost circuit is coupled between the first specific node and the second specific node, and is arranged for boosting the voltage of the second specific node.

The proposed circuit for driving a transistor may provide a high drive voltage to decrease a turn-on resistance of the transistor. The transistor may stay in a turned-on state for a predetermined period of time. Additionally, by employing a charge-sharing mechanism, the proposed circuit for driving the transistor may provide a drive voltage having a slight ripple.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "coupled" is intended to mean either an indirect or direct electrical connection. Accordingly, if one device is electrically connected to another device, that connection may be through a direct electrical connection, or through an indirect electrical connection via other devices and connections.

In order to provide a large drive current for a switch device (e.g. a high-side NMOS) and reduce power consumption, a charge-sharing concept and a plurality of voltage boost circuits (e.g. bootstrap circuits) are used to provide a stable drive voltage (e.g. a voltage beyond a supply voltage) for the switch device, thereby turning on the switch device for a predetermined period of time.

Figure 1:
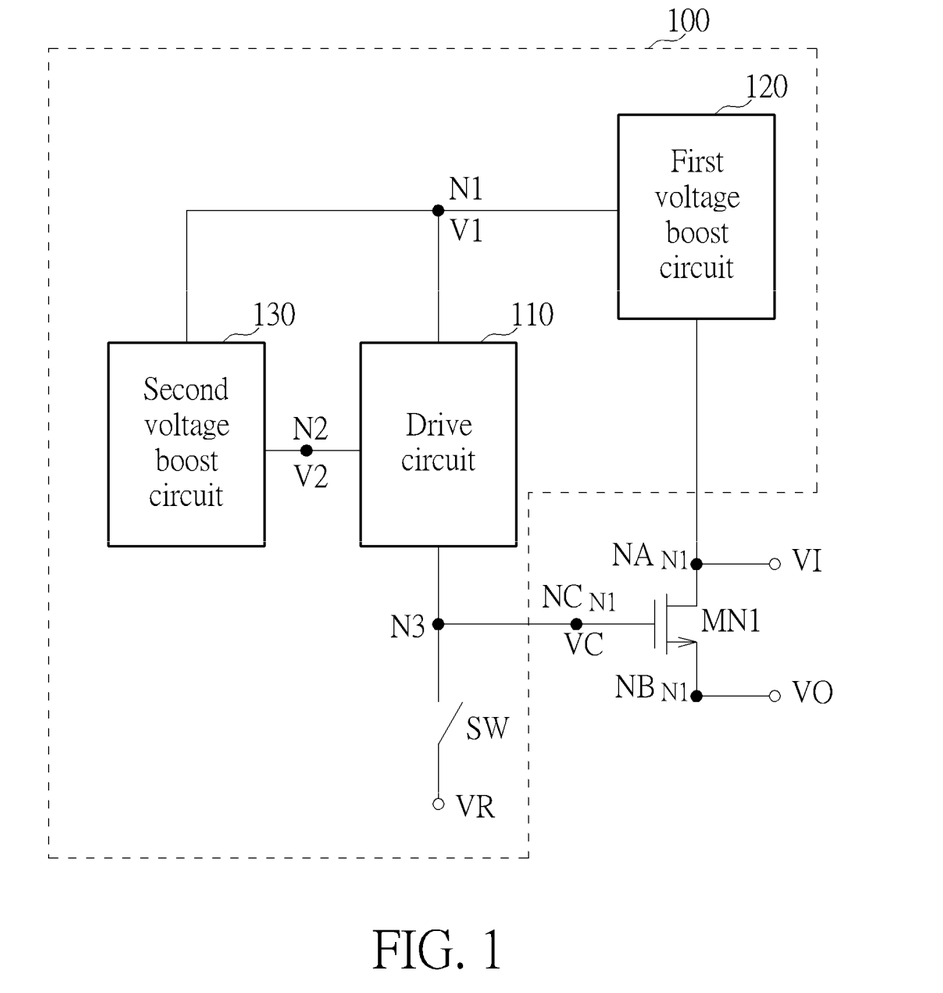
FIG. 1 is a block diagram illustrating an exemplary circuit for driving a transistor according to an embodiment of the present invention.

Please refer to FIG. 1, which is a block diagram illustrating an exemplary circuit for driving a transistor according to an embodiment of the present invention. In this embodiment, the transistor MN1 may be, but is not limited to, an NMOS switch. The transistor MN1 may include a control node $NC_{N1}$ and a plurality of connection nodes $NA_{N1}$ and $NB_{N1}$. The transistor MN1 is turned on and turned off according to a voltage VC of the control node $NC_{N1}$, and generates an output voltage (i.e. a voltage VO) at the connection node $NB_{N1}$ according to an input voltage (i.e. a voltage VI of the connection node $NA_{N1}$). As shown in FIG. 1, the circuit 100 for driving the transistor MN1 may include a drive circuit 110, a first voltage boost circuit 120, a second voltage boost circuit 130 and a switch device SW. The drive circuit 110 may have a first specific node N1, a second specific node N2 and a third specific node N3, wherein the third specific node N3 is coupled to the control node $NC_{N1}$ of the transistor MN1. The first voltage boost circuit 120 is coupled between the first specific node N1 and the connection node $NA_{N1}$ of the transistor MN1, and the second voltage boost circuit 130 is coupled between the first specific node N1 and the second specific node N2. The switch device SW is selectively coupled between the third specific node N3 and a reference voltage VR.

In this embodiment, the circuit 100 may determine whether to drive the transistor MN1 according to a switch state of the switch device SW. By way of example but not limitation, the reference voltage VR may be a low voltage (e.g. a ground voltage). When the switch device SW is turned on, the third specific node N3 may be coupled to the reference voltage VR, and a voltage difference between the control node $NC_{N1}$ and connection node $NB_{N1}$ may be less than a predetermined value. The transistor MN1 is turned off accordingly. In other words, the circuit 100 does not drive the transistor MN1. When the switch device SW is turned off, the drive circuit 110 may couple the first specific node N1 to the third specific node N3 according to a voltage V1 of the first specific node N1 and a voltage V2 of the second specific node N2 in order to charge the control node $NC_{N1}$ of the transistor MN1 (i.e. increasing the voltage VC). In other words, the circuit 100 will drive the transistor MN1, wherein the first voltage boost circuit 120 and the second voltage boost circuit 130 may be arranged to adjust/boost the voltage V1 and the voltage V2, respectively.

For example, when the voltage V1 is greater than the voltage V2, the drive circuit 110 is operative to couple the first specific node N1 to the third specific node N3. In one implementation, when the first specific node N1 is coupled to the third specific node N3, the voltage V1 may be greater than a reference voltage (e.g. a supply voltage), and the voltage V2 is not greater than the reference voltage. Hence, there is a large voltage difference between the first specific node N1 and the second specific node N2, thus allowing the drive circuit 110 to quickly and efficiently increase the voltage VC of the control node $NC_{N1}$ beyond the reference voltage. When the voltage V1 is not greater than the voltage V2, the drive circuit 110 is not operative to couple the first specific node N1 to the third specific node N3 (i.e. charges stored at the control node $NC_{N1}$ will not flow to the first specific node N1 through the drive circuit 110). In one implementation, when the first specific node N1 is not coupled to the third specific node N3, the voltage V2 is greater than a reference voltage (e.g. a supply voltage). Hence, it is ensured that the voltage V2 is greater than the voltage V1, thus preventing charges stored at the control node $NC_{N1}$ from flowing to the first specific node N1 from the third specific node N3 (i.e. the voltage VC is kept stable).

To facilitate an understanding of the present invention, an exemplary implementation is given in the following for further description of the proposed circuit for driving a transistor. It should be noted that other circuit implementations employing the architecture shown in FIG. 1 are feasible.

Figure 2:
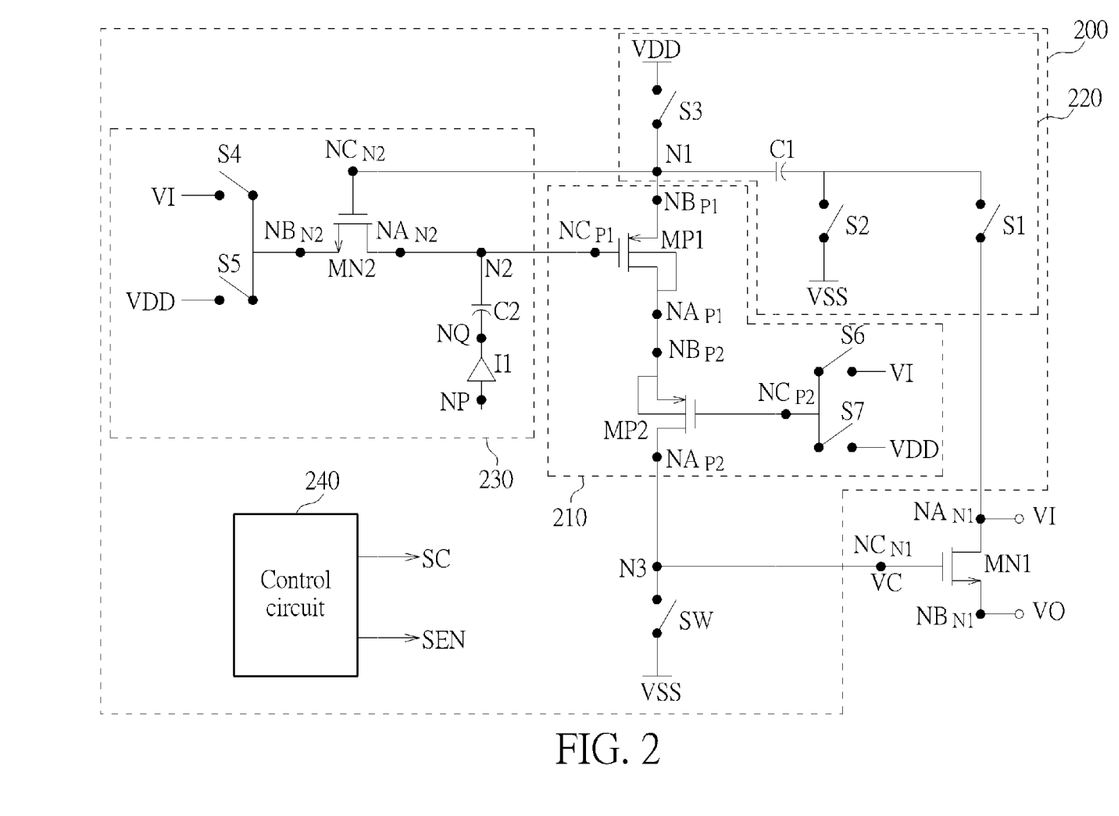
FIG. 2 is a diagram illustrating an implementation of the circuit for driving the transistor shown in FIG. 1.

Please refer to FIG. 2, which is a diagram illustrating an implementation of the circuit 100 for driving the transistor MN1 shown in FIG. 1. As shown in FIG. 2, the circuit 200 may include the switch device SW shown in FIG. 1, a drive circuit 210, a first voltage boost circuit 220, a second voltage boost circuit 230 and a control circuit 240. The drive circuit 110, the first voltage boost circuit 120 and the second voltage boost circuit 130 shown in FIG. 1 may implemented by the drive circuit 210, the first voltage boost circuit 220 and the second voltage boost circuit 230, respectively.

The control circuit 240 is coupled to the switch device SW, the drive circuit 210, the first voltage boost circuit 220 and the second voltage boost circuit 230, and is arranged to generate a control signal SC and an enable signal SEN to control the operations of the circuit 200. In this implementation, when the switch device SW is turned off according to the enable signal SEN, the circuit 200 may drive the transistor MN1 according to the control signal SC; when the switch device SW is turned on according to the enable signal SEN, the third specific node N3 may be coupled to a reference voltage (e.g. a ground voltage VSS), and the circuit 200 will stop driving the transistor MN1 accordingly.

The drive circuit 210 may include a plurality of transistor switches MP1 and MP2. The transistor switch MP1 may have a control node $NC_{P1}$ coupled to the second specific node N2, a connection node $NA_{P1}$, and a connection node $NB_{P1}$ coupled to the first specific node N1. The transistor switch MP2 may have a control node $NC_{P2}$, a connection node $NA_{P2}$ coupled to the control node $NC_{N1}$ of the transistor MN1, and a connection node $NB_{P2}$ coupled to the connection node $NA_{P1}$ of the transistor switch MP1. The control node $NC_{P2}$ of the transistor switch MP2 is coupled to the voltage VI of the connection node $NA_{N1}$ or a reference voltage (e.g. a supply voltage VDD) according to the enable signal SEN.

The first voltage boost circuit 220 may include a capacitor C1, wherein the control circuit 240 may control the capacitor C1 to be coupled between the first specific node N1 and the connection node $NA_{N1}$ of the transistor MN1 or between a reference voltage (i.e. the supply voltage VDD) through the first specific node N1 and another reference voltage (i.e. the ground voltage VSS).

The second voltage boost circuit 230 may include an inverter I1, a transistor switch MN2 and a capacitor C2. The inverter I1 may have an input node NP and an output node NQ, wherein the inverter I1 receives the control signal SC from the input node NP. The transistor switch MN2 may have a control node $NC_{N2}$, a connection node $NA_{N2}$ and a connection node $NB_{N2}$, wherein the control node $NC_{N2}$ is coupled to the first specific node N1, and the connection node $NA_{N2}$ is coupled to the second specific node N2. The control circuit 240 may control the connection node $NB_{N2}$ to be coupled to the voltage VI or a reference voltage (i.e. the supply voltage VDD). For example, the control circuit 240 may use the control signal SC to control the connection node $NB_{N2}$ to be coupled to the voltage VI or the supply voltage VDD. One terminal of the capacitor C2 is coupled to the second specific node N2, and the other terminal of the capacitor C2 is coupled to the output node NQ.

Figure 3:
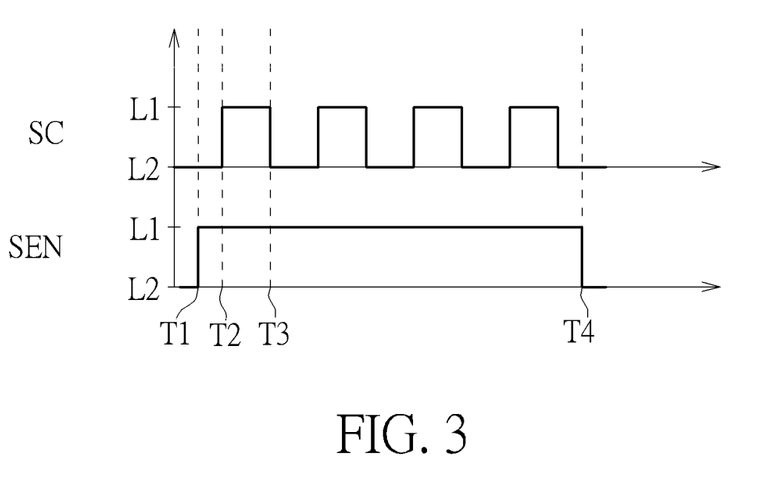
FIG. 3 is a timing diagram of the control signal and the enable signal used to control the operations of the circuit shown in FIG. 2.
Figure 4:
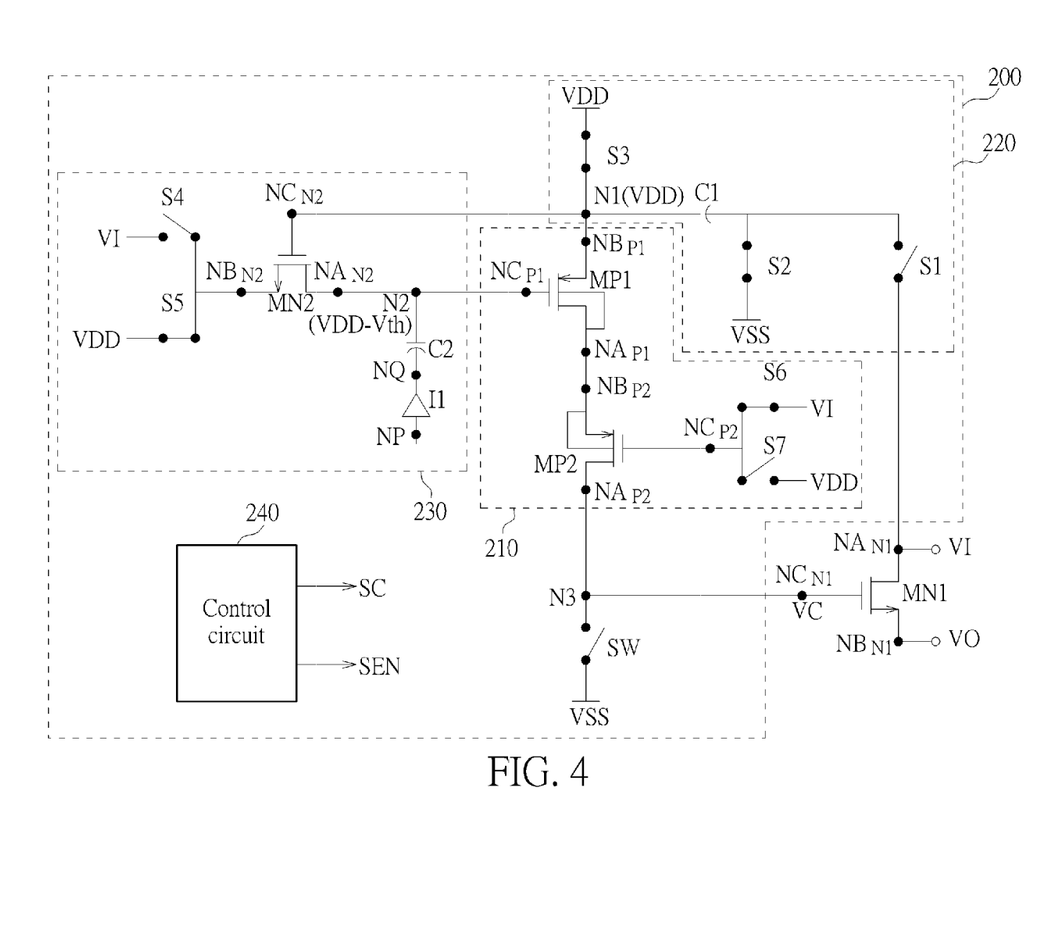
FIG. 4 is a diagram illustrating the operations of the circuit shown in FIG. 2 at a first time point shown in FIG. 3.

In practice, the first voltage boost circuit 220 may further include a plurality of switch devices S1-S3, the second voltage boost circuit 230 may further include a plurality of switch devices S4 and S5, and the drive circuit 210 may further include a plurality of switch devices S6 and S7. When properly controlled, the switch devices S1-S7 may be used to realize a transistor driving circuit capable of generating a high and stable drive voltage. Please refer to FIG. 3 and FIG. 4 together. FIG. 3 is a timing diagram of the control signal SC and the enable signal SEN used to control the operations of the circuit 200 shown in FIG. 2, and FIG. 4 is a diagram illustrating the operations of the circuit 200 shown in FIG. 2 at a first time point T1 shown in FIG. 3. At the first time point T1, the enable signal SEN is at a first level L1 (e.g. a high level), and the switch device SW is turned off (i.e. open). Hence, the circuit 200 may drive the transistor MN1 according to the control signal SC. When the enable signal SEN is at the first level L1, the switch device S7 is turned off and the switch device S6 is turned on (i.e. closed), allowing the control node $NC_{P2}$ to be coupled to the voltage VI. Additionally, as the control signal SC is at a second level L2 (e.g. a low level), the switch devices S1 and S4 are turned off according to the control signal SC, and the switch devices S2, S3 and S5 are turned on according to the control signal SC. Hence, two terminals of the capacitor C1 may be coupled to the supply voltage VDD and the ground voltage VSS, respectively (i.e. two terminals of the capacitor C1 may be charged to the supply voltage VDD and the ground voltage VSS, respectively), and the control node $NC_{N2}$ and the connection node $NB_{N2}$ may be coupled to the supply voltage VDD. The second specific node N2 (i.e. the connection node $NA_{N2}$ of the transistor switch MN2) may be charged to about "the supply voltage VDD minus a threshold voltage Vth of the transistor switch MP1" (i.e. VDD−Vth). The inverter I1 may output a voltage (equal to about the supply voltage VDD) at the output node NQ. In other words, a voltage drop across two terminals of the capacitor C2 may be equal to about the threshold voltage Vth.

Figure 5:
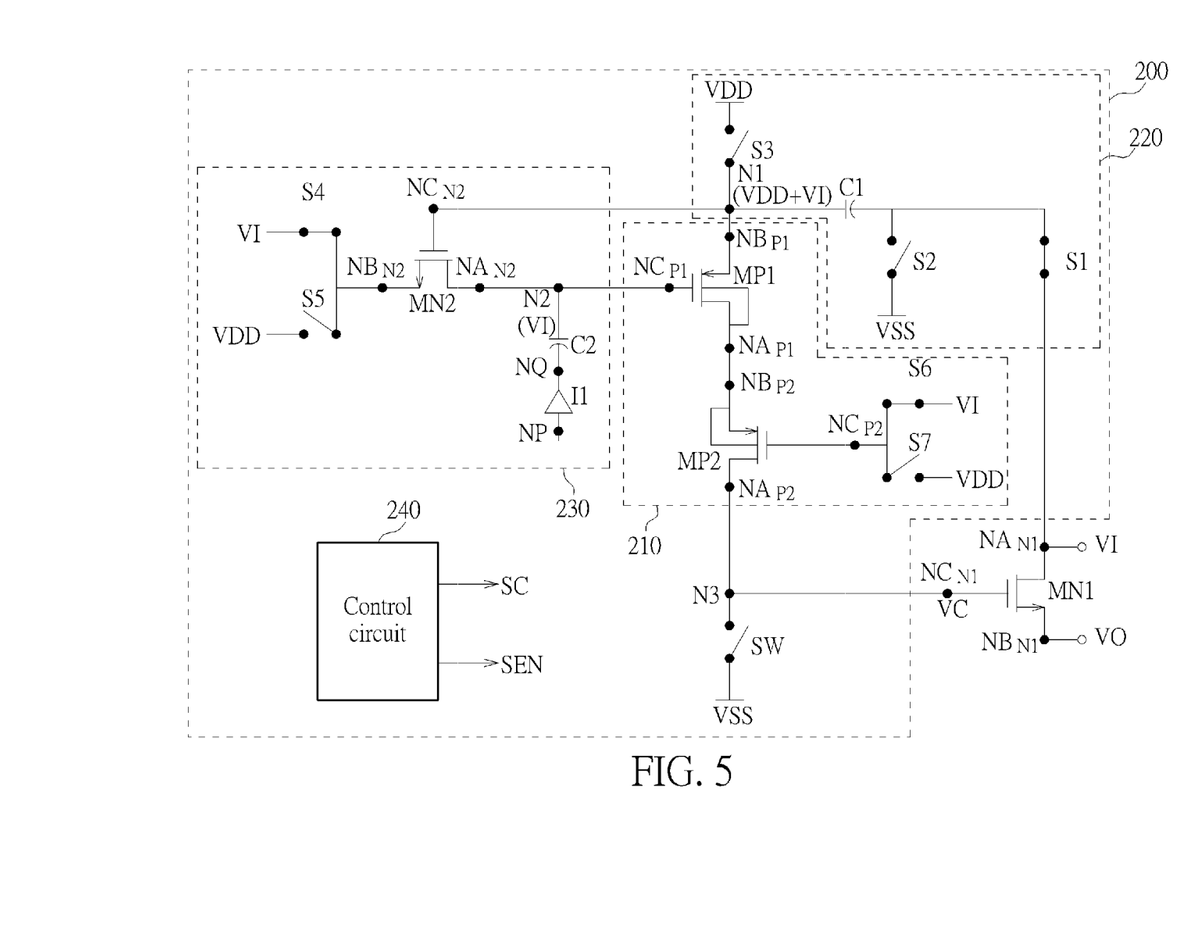
FIG. 5 is a diagram illustrating the operations of the circuit shown in FIG. 2 at a second time point shown in FIG. 3.

Please refer to FIG. 3 and FIG. 5 together. FIG. 5 is a diagram illustrating the operations of the circuit 200 shown in FIG. 2 at a second time point T2 shown in FIG. 3. At the second time point T2, the control signal SC is at the first level L1, wherein the switch devices S1 and S4 may be turned on according to the control signal SC, and the switch devices S2, S3 and S5 may be turned off according to the control signal SC. Hence, the voltage of the specific node N1 may be boosted, and the second specific node N2 may be coupled to the voltage VI through the transistor switch MN2, wherein the capacitor C1 may be regarded as a bootstrap capacitor in a bootstrap circuit. The capacitor C1 may share charges with the control node $NC_{N1}$ of the transistor MN1. After one or several clock cycles of the control signal SC, the voltage VC of the control node $NC_{N1}$ may be boosted to about "the supply voltage VDD plus the voltage VI of the connection node $NA_{N1}$" (i.e. VDD+VI).

Figure 6:
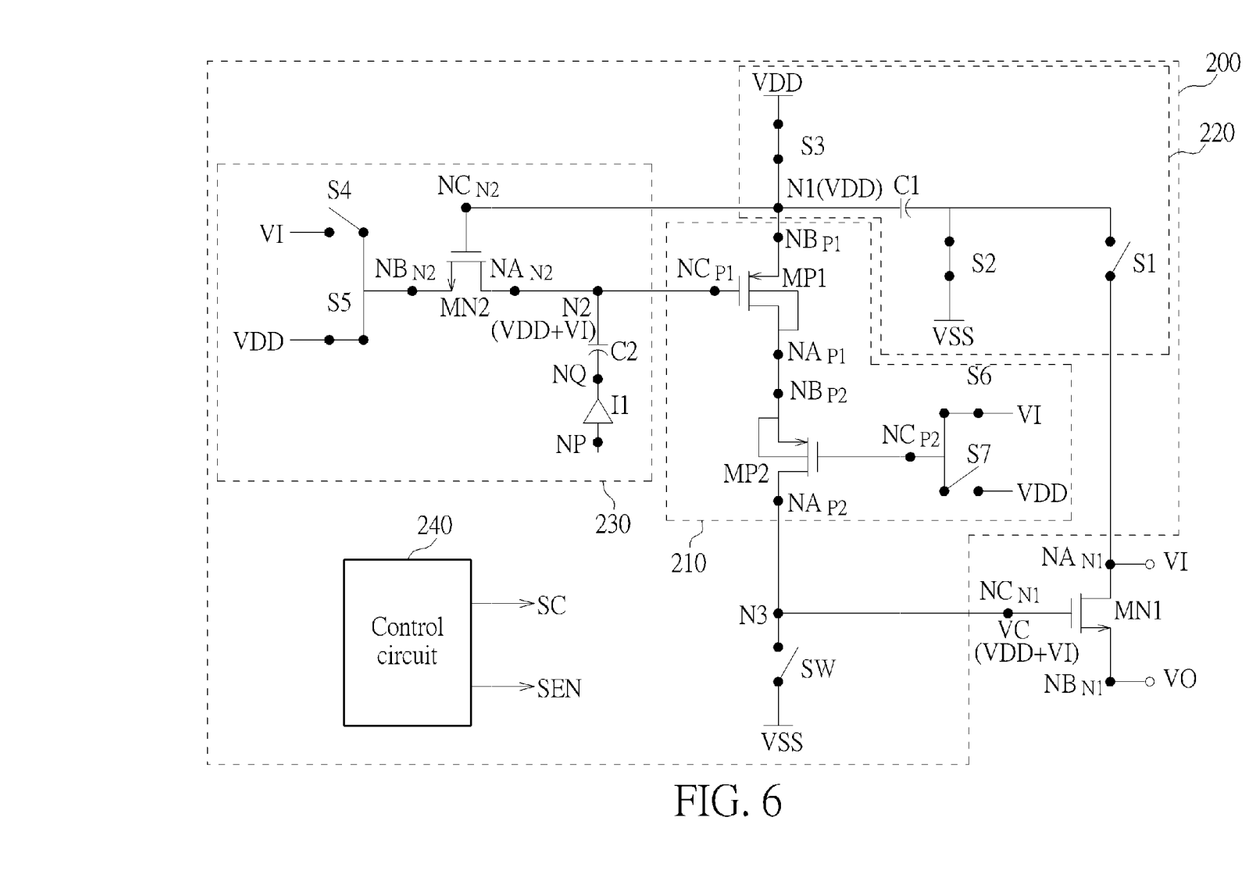
FIG. 6 is a diagram illustrating the operations of the circuit shown in FIG. 2 at a third time point shown in FIG. 3.

After the voltage VC is boosted up, the charges stored at the control node $NC_{N1}$ may leak through the transistor switch MP2. Please refer to FIG. 3 and FIG. 6 together. FIG. 6 is a diagram illustrating the operations of the circuit 200 shown in FIG. 2 at a third time point T3 shown in FIG. 3. At the third time point T3, the signal level of the control signal SC switches back to the second level L2. The first specific node N1 is coupled to the supply voltage VDD through the switch device S3 again, and the connection node $NB_{N2}$ is coupled to the supply voltage VDD through the switch device S5 again. The voltage of the second specific node N2 may be boosted (e.g. to VDD+VI). In other words, the capacitor C2 may be regarded as a bootstrap capacitor in a bootstrap circuit. As the voltage of the connection node $NB_{P1}$ is less than the voltage of the control node $NC_{P1}$ and the voltage of the control node $NC_{N1}$, the transistor switch MP1 is not turned on and a bulk-source parasitic diode (not shown in FIG. 6) thereof is reversed biased, ensuring that minimal/no charge may leak through the transistor switch MP1 and/or the transistor switch MP2. Thus, the transistor MN1 may stay in the turned-on state for a predetermined period of time.

Figure 7:
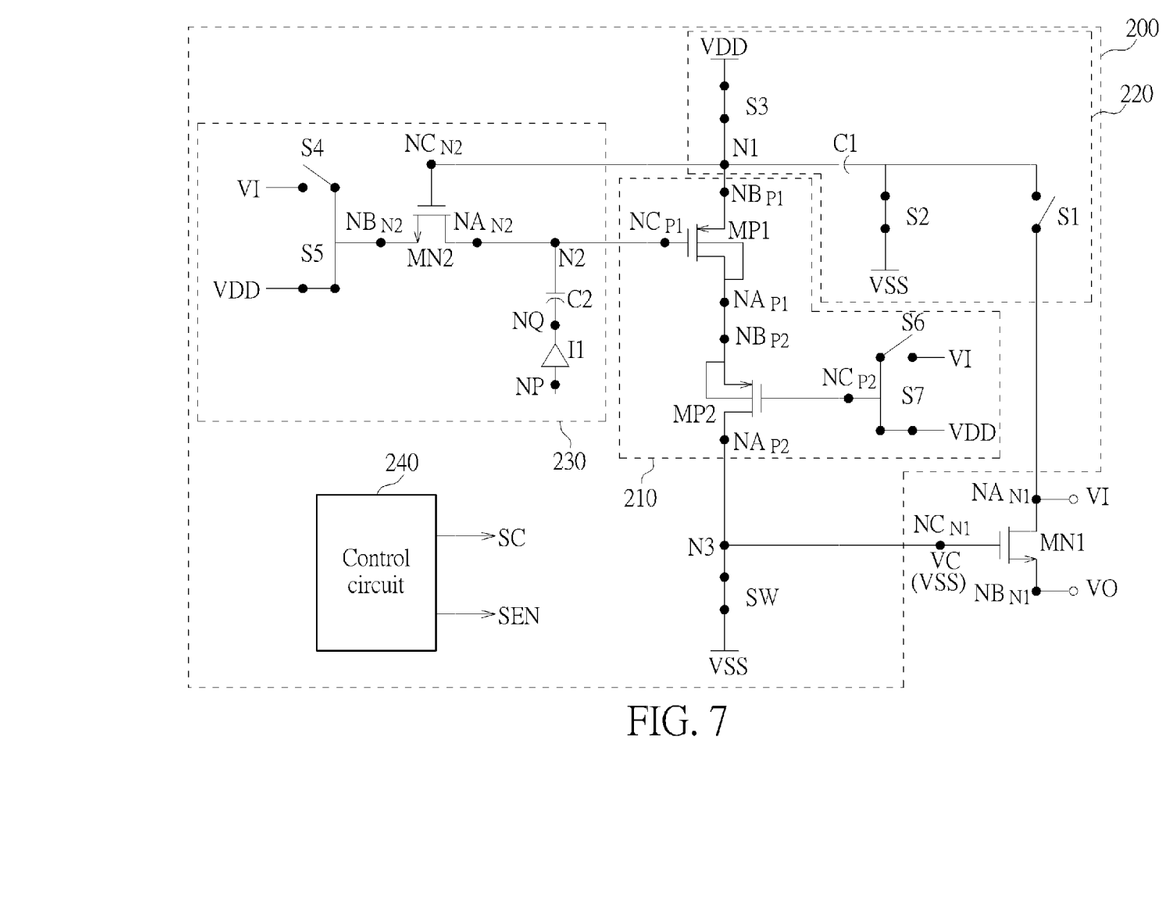
FIG. 7 is a diagram illustrating the operations of the circuit shown in FIG. 2 at a fourth time point shown in FIG. 3.

Please refer to FIG. 3 and FIG. 7. FIG. 7 is a diagram illustrating the operations of the circuit 200 shown in FIG. 2 at a fourth time point T4 shown in FIG. 3. At the fourth time point T4, the enable signal SEN is at the second level L2. Hence, the switch devices SW and S7 are turned on, and the switch device S6 is turned off. As the control node $NC_{P2}$ of the transistor switch MP2 is coupled to the supply voltage VDD through the switch device S7, the transistor switch MP2 is not turned on (i.e. the first specific node N1 is not coupled to the third specific node N3). Additionally, the control node $NC_{N1}$ of the transistor MN1 is coupled to the ground voltage VSS through the switch device SW. In brief, there is no conduction path from the first specific node N1 (or the supply voltage VDD) to the control node $NC_{N1}$ at the fourth time point T4.

Please note that although the voltage boost circuit 120/130 shown in FIG. 1 may be implemented by a bootstrap circuit (e.g. the voltage boost circuit 220/230 shown in FIG. 2), it is feasible to employ other types of circuits to implement the voltage boost circuit 120/130 shown in FIG. 1. In one implementation, the first voltage boost circuit 120 shown in FIG. 1 may be implemented by the first voltage boost circuit 220 shown in FIG. 2, while the second voltage boost circuit 130 shown in FIG. 1 may be implemented by a voltage boost circuit instead of a bootstrap circuit (e.g. the second voltage boost circuit 230 shown in FIG. 2). In another implementation, the second voltage boost circuit 130 shown in FIG. 1 may be implemented by the second voltage boost circuit 230 shown in FIG. 2, while the first voltage boost circuit 120 shown in FIG. 1 may be implemented by a voltage boost circuit instead of a bootstrap circuit (e.g. the first voltage boost circuit 220 shown in FIG. 2). Additionally, a transistor driven by the circuit 100 shown in FIG. 1 (or the circuit 200 shown in FIG. 2) is not limited to an NMOS switch. Further, the signal levels shown in FIG. 3 are for illustrative purposes only. For example, the high level of the control signal SC may be different from that of the enable signal SEN, and/or the low level of the control signal SC may be different from that of the enable signal SEN.

Figure 8:
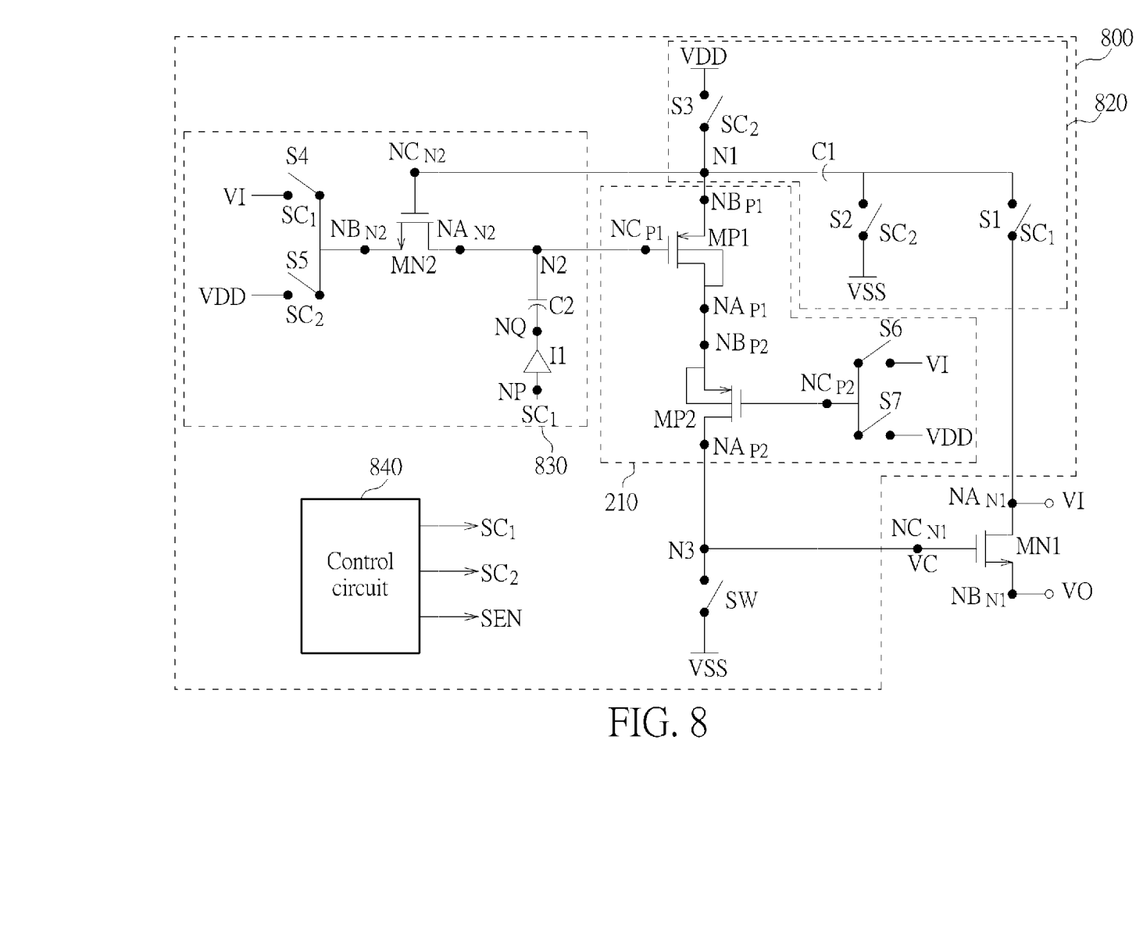
FIG. 8 is a diagram illustrating another implementation of the circuit for driving the transistor shown in FIG. 1.

The switch devices S1-S5 may operate according to non-overlapping control signals in order to improve performance and/or reliability. Please refer to FIG. 8, which is a diagram illustrating another implementation of the circuit 100 for driving the transistor MN1 shown in FIG. 1. As shown in FIG. 8, the circuit 800 may include the switch device SW shown in FIG. 1, the drive circuit 210 shown in FIG. 2, a first voltage boost circuit 820, a second voltage boost circuit 830 and a control circuit 840. The architecture of the circuit 800 is based on that of the circuit 200 shown in FIG. 2, wherein the main difference is that the control circuit 840 may generate a plurality of control signals $SC_1$ and $SC_2$. Each of the first voltage boost circuit 820 and the second voltage boost circuit 830 operates according to the generated control signals $SC_1$ and $SC_2$.

Figure 9:
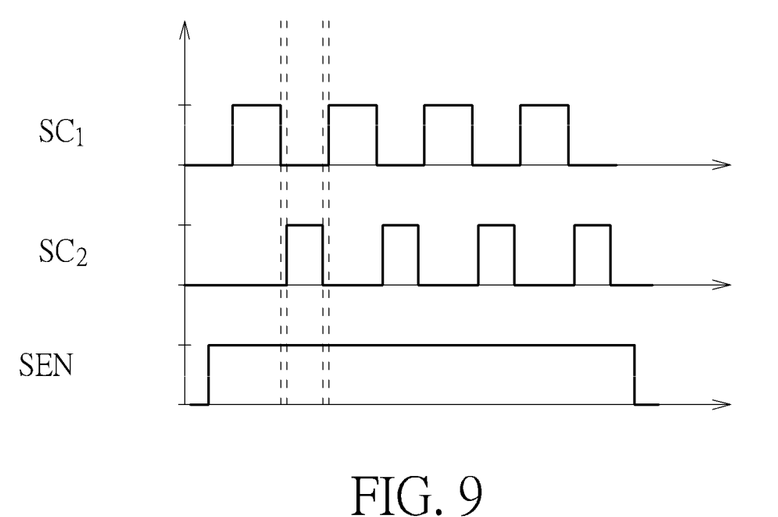
FIG. 9 is a timing diagram of the control signals and the enable signal used to control the operations of the circuit shown in FIG. 8.

Please refer to FIG. 9 in conjunction with FIG. 8. FIG. 9 is a timing diagram of the control signals $SC_1$ and $SC_2$ and the enable signal SEN used to control the operations of the circuit 800 shown in FIG. 8. As shown in FIG. 9, the control signals $SC_1$ and $SC_2$ are non-overlapping. Regarding the first voltage boost circuit 820, when the control signal $SC_1$ is at a specific level (e.g. a high level), the connection node $NB_{N2}$ of the transistor switch MN2 is coupled to the voltage VI of the connection node $NA_{N1}$ of the transistor MN1. In addition, when the control signal $SC_2$ is at the specific level, the connection node $NB_{N2}$ of the transistor switch MN2 is coupled to a first reference voltage (i.e. the supply voltage VDD). In other words, the switch device S4 is controlled by the control signal $SC_1$, and the switch device S5 is controlled by the control signal $SC_2$. Regarding the second voltage boost circuit 830, when the control signal $SC_1$ is at a specific level (e.g. a high level), the capacitor C1 is coupled between the first specific node N1 and the connection node $NA_{N1}$ of the transistor MN1. In addition, when the control signal $SC_2$ is at the specific level, one terminal of the capacitor C1 is coupled to the first reference voltage (i.e. the supply voltage VDD) through the first specific node N1, and the other terminal of the capacitor C1 is coupled to a second reference voltage different from the first reference voltage (i.e. the ground voltage VSS). In other words, the switch device S1 is controlled by the control signal $SC_1$, and the switch devices S2 and S3 are controlled by the control signal $SC_2$. As a person skilled in the art should readily understand the operations of the circuit 800 shown in FIG. 8 (which operates according to the timing diagram shown in FIG. 9) after reading the paragraphs directed to FIG. 1-FIG. 7, further description is omitted here for brevity.

Figure 10:
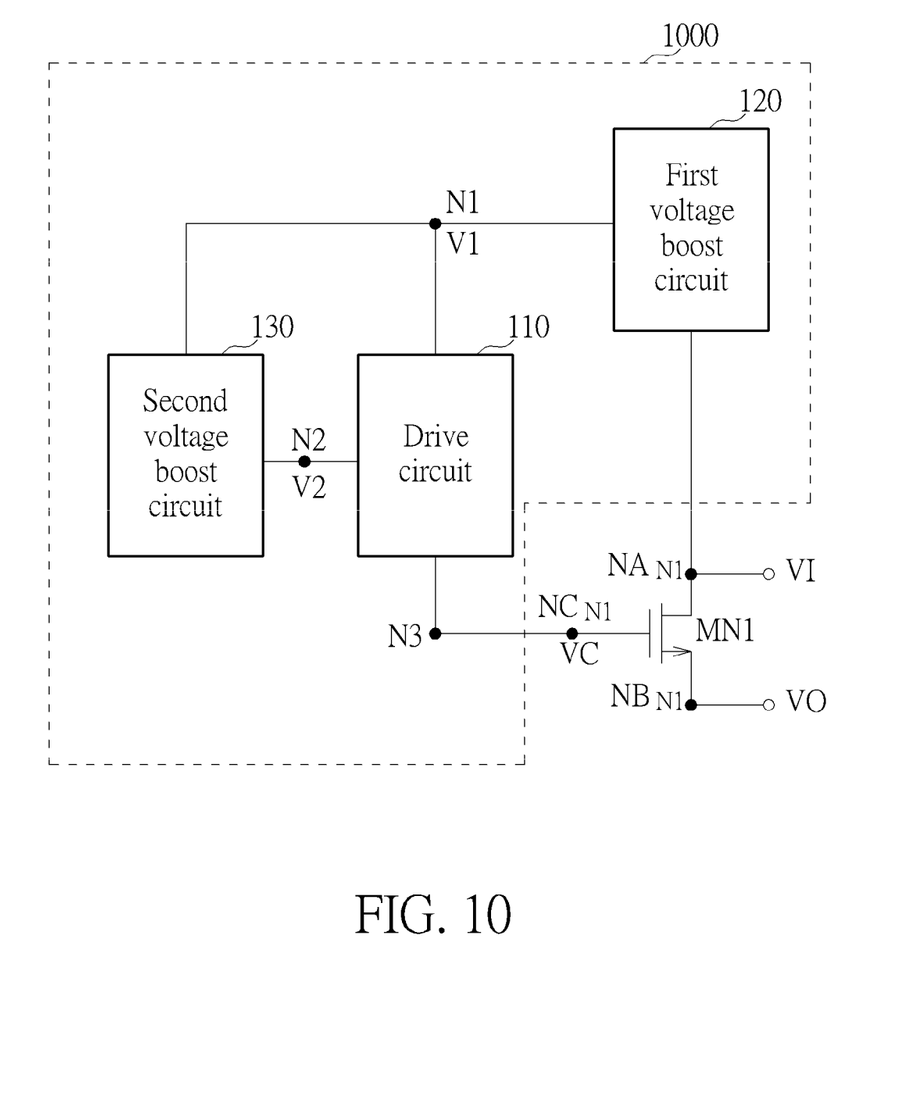
FIG. 10 is a block diagram illustrating an exemplary circuit for driving a transistor according to another embodiment of the present invention.

Please refer to FIG. 1 and FIG. 2 again. In view of the above, the drive circuit 110/210 may couple the first specific node N1 to the third specific node N3 according to the voltage of the first specific node N1, the voltage of the second specific node N2 and a switch state of the switch device SW (or the enable signal SEN). When the switch device SW is turned off, the proposed drive mechanism may be realized with the drive circuit 110, the first voltage boost circuit 120 and the second voltage boost circuit 130. Hence, the switch device SW may be optional when the proposed drive mechanism operates. Please refer to FIG. 10, which is a block diagram illustrating an exemplary circuit for driving a transistor according to another embodiment of the present invention. The architecture of the circuit 1000 is based on that of the circuit 100 shown in FIG. 1, wherein the main difference is that the circuit 1000 does not include the switch device SW shown in FIG. 1. After reading the paragraphs directed to FIG. 1-FIG. 9, a person skilled in the art should understand that the drive circuit 110 may still couple the first specific node N1 to the third specific node N3 according to the voltages V1 and V2 even though the switch device SW is omitted. Hence, the circuit 1000 may charge the control node $NC_{N1}$ to thereby provide a high and stable drive voltage for the transistor MN1. For the sake of brevity, similar descriptions are not repeated here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit for driving a transistor, comprising:
   a drive circuit, having a first specific node, a second specific node and a third specific node, wherein the third specific node is coupled to a control node of the transistor, and the drive circuit is arranged for coupling the first specific node to the third specific node according to at least a voltage of the first specific node and a voltage of the second specific node in order to charge the control node of the transistor;
   a first voltage boost circuit, coupled between the first specific node and a connection node of the transistor, the first voltage boost circuit arranged for boosting the voltage of the first specific node; and
   a second voltage boost circuit, coupled between the first specific node and the second specific node, the second voltage boost circuit arranged for receiving the voltage of the first specific node provided by the first voltage boost circuit, and boosting the voltage of the second specific node at least according to the voltage of the first specific node.

2. The circuit of claim 1, wherein at least one of the first voltage boost circuit and the second voltage boost circuit is a bootstrap circuit.

3. The circuit of claim 1, wherein when the voltage of the first specific node is greater than the voltage of the second specific node, the drive circuit is operative to couple the first specific node to the third specific node.

4. The circuit of claim 3, wherein when the first specific node is coupled to the third specific node, the voltage of the first specific node is greater than a reference voltage, and the voltage of the second specific node is not greater than the reference voltage.

5. The circuit of claim 4, wherein the reference voltage is a supply voltage.

6. The circuit of claim 1, wherein when the voltage of the first specific node is not greater than the voltage of the second specific node, the drive circuit is not operative to couple the first specific node to the third specific node.

7. The circuit of claim 6, wherein when the first specific node is not coupled to the third specific node, the voltage of the second specific node is greater than a reference voltage.

8. The circuit of claim 7, wherein the reference voltage is a supply voltage.

9. The circuit of claim 1, wherein the second voltage boost circuit comprises:
   an inverter, having an input node and an output node, wherein the inverter receives a first control signal from the input node;
   a transistor switch, having a control node, a first connection node and a second connection node, wherein the control node of the transistor switch is coupled to the first specific node, and the first connection node of the transistor switch is coupled to the second specific node; and
   a first capacitor, wherein one terminal of the first capacitor is coupled to the second specific node, and the other terminal of the first capacitor is coupled to the output node; and
   the circuit further comprises:
   a control circuit, coupled to the second voltage boost circuit, the control circuit arranged for generating the first control signal and controlling the second connection node of the transistor switch to be coupled to a voltage of the connection node of the transistor or a first reference voltage.

10. The circuit of claim 9, wherein when the first control signal is at a first level, the second connection node of the transistor switch is coupled to the voltage of the connection node of the transistor, and when the control signal is at a second level different from the first level, the second connection node of the transistor switch is coupled to the first reference voltage.

11. The circuit of claim 10, wherein the first voltage boost circuit comprises a second capacitor; when the first control signal is at the first level, the second capacitor is coupled between the first specific node and the connection node of the transistor; and when the first control signal is at the second level, one terminal of the second capacitor is coupled to the first reference voltage through the first specific node, and the other terminal of the second capacitor is coupled to a second reference voltage different from the first reference voltage.

12. The circuit of claim 9, wherein the control circuit further generates a second control signal; the second control signal and the first control signal are non-overlapping; and when the first control signal is at a specific level, the second connection node of the transistor switch is coupled to the voltage of the connection node of the transistor, and when the second control signal is at the specific level, the second connection node of the transistor switch is coupled to the first reference voltage.

13. The circuit of claim 12, wherein the first voltage boost circuit comprises a second capacitor; when the first control signal is at the specific level, the second capacitor is coupled between the first specific node and the connection node of the transistor; and when the second control signal is at the specific level, one terminal of the second capacitor is coupled to the first reference voltage through the first specific node, and the other terminal of the second capacitor is coupled to a second reference voltage different from the first reference voltage.

14. The circuit of claim 9, wherein the first reference voltage is a supply voltage.

15. The circuit of claim 1, wherein the first voltage boost circuit comprises a capacitor, and the circuit further comprises:
a control circuit, coupled to the first voltage boost circuit, the control circuit arranged for controlling the capacitor to be coupled between the first specific node and the connection node of the transistor or between a first reference voltage and a second reference voltage different from the first reference voltage.

16. The circuit of claim 15, wherein the control circuit further generates a first control signal; when the first control signal is at a first level, the capacitor is coupled between the first specific node and the connection node of the transistor; and when the first control signal is at a second level different from the first level, one terminal of the capacitor is coupled to the first reference voltage through the first specific node, and the other terminal of the capacitor is coupled to the second reference voltage.

17. The circuit of claim 15, wherein the control circuit further generates a first control signal and a second control signal; the first control signal and the second control signal are non-overlapping; when the first control signal is at a specific level, the capacitor is coupled between the first specific node and the connection node of the transistor; and when the second control signal is at the specific level, one terminal of the capacitor is coupled to the first reference voltage through the first specific node, and the other terminal of the capacitor is coupled to the second reference voltage.

18. The circuit of claim 1, further comprising:
a control circuit, coupled to the drive circuit, the control circuit arranged for generating an enable signal to the drive circuit;
wherein the drive circuit couples the first specific node to the third specific node according to the voltage of the first specific node, the voltage of the second specific node and the enable signal.

19. The circuit of claim 18, wherein when the enable signal is at a first level, the drive circuit is operative to couple the first specific node to the third specific node according to the voltage of the first specific node and the voltage of the second specific node, and when the enable signal is at a second level different from the first level, the drive circuit is not operative to couple the first specific node to the third specific node.

20. The circuit of claim 19, further comprising:
a switch device, controlled by the enable signal, wherein when the enable signal is at the second level, the switch device couples the third specific node to a reference voltage.

21. The circuit of claim 19, wherein the drive circuit comprises:

a first transistor switch, having a control node coupled to the second specific node, a first connection node, and a second connection node coupled to the first specific node; and
a second transistor switch, having a control node, a first connection node coupled to the control node of the transistor, and a second connection node coupled to the first connection node of the first transistor switch, wherein when the enable signal is at the first level, the control node of the second transistor switch is coupled to a voltage of the connection node of the transistor, and when the enable signal is at the second level, the control node of the second transistor switch is coupled to a reference voltage.

22. A circuit for driving a transistor, comprising:
a drive circuit, having a first specific node, a second specific node and a third specific node, wherein the third specific node is coupled to a control node of the transistor, and the drive circuit is arranged for coupling the first specific node to the third specific node according to at least a voltage of the first specific node and a voltage of the second specific node in order to charge the control node of the transistor;
a first voltage boost circuit, coupled between the first specific node and a connection node of the transistor, the first voltage boost circuit arranged for boosting the voltage of the first specific node; and
a second voltage boost circuit, coupled between the first specific node and the second specific node, the second voltage boost circuit arranged for boosting the voltage of the second specific node, wherein the second voltage boost circuit comprises:
an inverter, having an input node and an output node, wherein the inverter receives a first control signal from the input node;
a transistor switch, having a control node, a first connection node and a second connection node, wherein the control node of the transistor switch is coupled to the first specific node, and the first connection node of the transistor switch is coupled to the second specific node; and
a first capacitor, wherein one terminal of the first capacitor is coupled to the second specific node, and the other terminal of the first capacitor is coupled to the output node; and
the circuit further comprises:
a control circuit, coupled to the second voltage boost circuit, the control circuit arranged for generating the first control signal and controlling the second connection node of the transistor switch to be coupled to a voltage of the connection node of the transistor or a first reference voltage.

23. The circuit of claim 22, wherein when the first control signal is at a first level, the second connection node of the transistor switch is coupled to the voltage of the connection node of the transistor, and when the control signal is at a second level different from the first level, the second connection node of the transistor switch is coupled to the first reference voltage.

24. The circuit of claim 23, wherein the first voltage boost circuit comprises a second capacitor; when the first control signal is at the first level, the second capacitor is coupled between the first specific node and the connection node of the transistor; and when the first control signal is at the second level, one terminal of the second capacitor is coupled to the first reference voltage through the first specific node, and the other terminal of the second capacitor is coupled to a second reference voltage different from the first reference voltage.

25. The circuit of claim 22, wherein the control circuit further generates a second control signal; the second control signal and the first control signal are non-overlapping; and when the first control signal is at a specific level, the second connection node of the transistor switch is coupled to the voltage of the connection node of the transistor, and when the second control signal is at the specific level, the second connection node of the transistor switch is coupled to the first reference voltage.

26. The circuit of claim 25, wherein the first voltage boost circuit comprises a second capacitor; when the first control signal is at the specific level, the second capacitor is coupled between the first specific node and the connection node of the transistor; and when the second control signal is at the specific level, one terminal of the second capacitor is coupled to the first reference voltage through the first specific node, and the other terminal of the second capacitor is coupled to a second reference voltage different from the first reference voltage.

27. The circuit of claim 22, wherein the first reference voltage is a supply voltage.

28. A circuit for driving a transistor, comprising:
a drive circuit, having a first specific node, a second specific node and a third specific node, wherein the third specific node is coupled to a control node of the transistor, and the drive circuit is arranged for coupling the first specific node to the third specific node according to at least a voltage of the first specific node and a voltage of the second specific node in order to charge the control node of the transistor;
a first voltage boost circuit, coupled between the first specific node and a connection node of the transistor, the first voltage boost circuit arranged for boosting the voltage of the first specific node;
a second voltage boost circuit, coupled between the first specific node and the second specific node, the second voltage boost circuit arranged for boosting the voltage of the second specific node; and
a control circuit, coupled to the drive circuit, the control circuit arranged for generating an enable signal to the drive circuit;
wherein the drive circuit couples the first specific node to the third specific node according to the voltage of the first specific node, the voltage of the second specific node and the enable signal.

29. The circuit of claim 28, wherein when the enable signal is at a first level, the drive circuit is operative to couple the first specific node to the third specific node according to the voltage of the first specific node and the voltage of the second specific node, and when the enable signal is at a second level different from the first level, the drive circuit is not operative to couple the first specific node to the third specific node.

30. The circuit of claim 29, further comprising:
a switch device, controlled by the enable signal, wherein when the enable signal is at the second level, the switch device couples the third specific node to a reference voltage.

31. The circuit of claim 29, wherein the drive circuit comprises:
a first transistor switch, having a control node coupled to the second specific node, a first connection node, and a second connection node coupled to the first specific node; and
a second transistor switch, having a control node, a first connection node coupled to the control node of the transistor, and a second connection node coupled to the first connection node of the first transistor switch, wherein when the enable signal is at the first level, the control node of the second transistor switch is coupled to a voltage of the connection node of the transistor, and when the enable signal is at the second level, the control node of the second transistor switch is coupled to a reference voltage.

* * * * *